(12) United States Patent
Kim

(10) Patent No.: US 8,319,264 B2
(45) Date of Patent: Nov. 27, 2012

(54) SEMICONDUCTOR DEVICE AND METHOD FOR MANUFACTURING THE SAME

(75) Inventor: Seung Bum Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 12/979,865

(22) Filed: Dec. 28, 2010

(65) Prior Publication Data

US 2011/0260238 A1   Oct. 27, 2011

(30) Foreign Application Priority Data

Apr. 26, 2010  (KR) .................. 10-2010-0038527

(51) Int. Cl.
*H01L 29/94* (2006.01)

(52) U.S. Cl. ............... 257/296; 257/300; 257/E21.538; 257/E21.627; 257/E21.658; 438/523; 438/533; 438/571; 438/597; 438/618; 438/620; 438/621; 438/666

(58) Field of Classification Search .............. 257/296, 257/300, E21.538, E21.627, E21.658; 438/523, 438/533, 571, 597, 618, 620, 621, 666
See application file for complete search history.

(56) References Cited

U.S. PATENT DOCUMENTS

| 5,565,372 | A  | * | 10/1996 | Kim ................................. 438/253 |
| 6,391,736 | B1 | * | 5/2002  | Uh et al. ......................... 438/396 |
| 6,955,974 | B2 | * | 10/2005 | Lee et al. ........................ 438/437 |
| 2004/0175919 | A1 | * | 9/2004 | Ha et al. ........................ 438/620 |

FOREIGN PATENT DOCUMENTS

| KR | 10-1998-057073 A | 9/1998 |
| KR | 10-2011-0001189 A | 1/2011 |
| KR | 10-2011-0029672 A | 3/2011 |

* cited by examiner

*Primary Examiner* — Asok Sarkar
(74) *Attorney, Agent, or Firm* — William Park & Associates Ltd.

(57) ABSTRACT

A semiconductor device comprises: a semiconductor substrate including an active region defined as a device isolation film; a bit line contact hole obtained by etching the semiconductor substrate; a bit line contact plug having a smaller width than that of the bit line contact hole; and a bit line connected to the upper portion of the bit line contact plug, thereby preventing a short of the bit line contact plug and the storage node contact plug to improve characteristics of the semiconductor device.

21 Claims, 10 Drawing Sheets

SEMICONDUCTOR DEVICE AND METHOD FOR MANUFACTURING THE SAME

CROSS-REFERENCE TO RELATED APPLICATION

The priority of Korean patent application No. 10-2010-0038527 filed on Apr. 26, 2010, the disclosure of which is hereby incorporated in its entirety by reference, is claimed.

BACKGROUND OF THE INVENTION

1. Field of the Invention

Embodiments of the present invention generally relates to a semiconductor device and a method for manufacturing the same, and more specifically, to a semiconductor device and a method for manufacturing the same that prevents a short between a bit line contact plug and a storage node contact plug to improve characteristics of the semiconductor device.

2. Description of the Related Art

A semiconductor device can be operated depending on a designated object through processes of implanting impurities into a given region in a silicon wafer or depositing a new material. In order to perform the designated object, the semiconductor device comprises various elements such as a transistor, a capacitor and a resistor which are connected through a conductive layer in order to exchange data or signals.

As a manufacturing technique of the semiconductor device has been developed to improve integration of the semiconductor device, an effort of forming more chips in one wafer has been continued. As a result, the minimum width of the design rule has been smaller in order to increase the integration. Also, the semiconductor device has been required to operate at a faster speed and reduce power consumption.

In order to improve the integration, the size of components in the semiconductor device is required to be reduced, and the length and width of connection lines are required to be decreased. Lines used in a semiconductor memory device include a word line for transmitting control signals and a bit line for transmitting data. When the width or cross-section of the word line and the bit line are reduced, resistance that disturbs transmission of control signals or data increases. The increase of resistance delays the transmission speed of signals and data in the semiconductor device, increases power consumption and degrades operation stability of the semiconductor memory device.

In spite of increase of the integration, when the width of the word line and the bit line is maintained to prevent the increase of resistance like the prior art, a physical distance between adjacent word lines or bit lines cannot but become closer. In case of the bit line for transmitting data transmitted from a unit cell capacitor in comparison with the word line for transmitting control signals with a relatively high potential, data may not be normally transmitted by increase of parasite capacitance. When data are smoothly transmitted through the bit line, a sense amplifier for sensing and amplifying data cannot sense the data, which means that the semiconductor device cannot output data stored in a unit cell to the outside.

In order to prevent the increase of parasite capacitance of the bit line, the amount of electric charges corresponding to data outputted from the unit cell may be increased. The size of the capacitor in the unit cell of the semiconductor memory device is required to become larger so as to increase the amount of charges. However, as the integration of the semiconductor memory device increases, the area occupied by the capacitor of the semiconductor memory device is also reduced.

The reduction of the area occupied by the capacitor means the decrease of the size of the unit cell of the semiconductor device. For example, the size of the unit cell decreases from 8F2 to 6F2 and from 6F2 to 4F2. F means the minimum distance between fine patterns on the design rule. The reduction of the size of the unit cell may be understood as the decrease of the minimum distance between fine patterns on the design rule.

It means that the size of the unit cell of 8F2 is reduced by 2F2 in case of a semiconductor device having the unit cell of 6F2. As a result, in case of the semiconductor device having a unit cell of 8F2, an active region having an oval shape has a major axis is in parallel to that of a bit line, and a word line has a protruded structure toward a semiconductor substrate. However, in case of the semiconductor device having a unit cell of 6F2, an active region having an oval shape has a major axis tilted at a given angle with that of a bit line, and a word line has a buried-type gate buried in a semiconductor substrate.

In case of the semiconductor device having a unit cell of 6F2, a bit line contact plug is coupled with an active region between buried-type gates, and a bit line is coupled to the upper portion of the bit line contact plug. Also, a storage node contact plug is disposed at both sides of the bit line and connected to the active region.

However, the bit lines are mis-aligned so that the bit line is not connected to the center part of the bit line contact plug but to the end of the bit line contact plug. The bit line contact plug is connected to the storage node contact plug disposed at both side of the bit line, which results in a short.

In order to prevent the short between the bit line contact plug and the storage node contact plug, the width of the bit line is formed to be larger or the width of the spacer disposed at sidewalls of the bit lines is formed to be thicker. As a result, the contact area between the active region and the storage node contact plug is reduced, thereby increasing resistance.

BRIEF SUMMARY OF THE INVENTION

Various embodiments of the invention are directed to providing a semiconductor device and a method for forming the same that substantially obviate one or more problems due to limitations and disadvantages of the related art.

According to an embodiment of the present invention, a semiconductor device comprises: a semiconductor substrate including an active region defined as a device isolation film; a bit line contact hole obtained by etching the semiconductor substrate; a bit line contact plug having a smaller width than that of the bit line contact hole; and a bit line connected to the upper portion of the bit line contact plug.

The device isolation film includes: a trench formed in the semiconductor substrate; a sidewall oxide film formed on the surface of the trench; a liner nitride film formed on the surface of the sidewall oxide film; and a separate insulating film formed on the surface of the liner nitride film so as to bury the trench.

The side cross-sectional surface of the bit line contact hole has the same width of the upper portion as that of the lower portion of the bit line contact hole.

The side cross-sectional surface of the bit line contact hole has a larger width of the upper portion than that of the lower portion of the bit line contact hole.

The bit line contact plug has the same width as that of the bit line.

The semiconductor device further comprises a spacer formed in sidewalls of the bit line and the bit line contact plug.

The spacer is buried in the bit line contact hole.

The semiconductor device further comprises a storage node contact plug formed to be adjacent to the bit line.

The semiconductor device further comprises a buried-type gate buried in the semiconductor substrate.

According to an embodiment of the present invention, a method for manufacturing a semiconductor device comprises: forming a device isolation film in a semiconductor substrate; etching the semiconductor substrate to form a bit line contact hole; forming a bit line on the upper portion of the semiconductor substrate and a bit line contact plug to have a smaller width than that of the bit line contact hole.

The forming-a-device-isolation-film includes: forming a trench for device isolation; forming a sidewall oxide film in the sidewall and the lower portion of the trench for device isolation; forming a liner nitride film on the upper portion of the sidewall oxide film; and forming a separate insulating film on the upper portion of the liner nitride film to bury the trench for device isolation.

After forming a device isolation film, the method further comprises forming a buried-type gate buried in the semiconductor substrate.

Before forming a bit line contact hole, the method further comprises forming an insulating film on the semiconductor substrate.

The forming-a-bit-line-contact-hole includes: etching a portion of the device isolation film and the insulating film to form a first bit line contact hole; and forming a second bit line contact hole to etch the active region to the bottom portion of the first bit line contact hole to expose the device isolation film.

The device isolation film and the active region are etched with the same etch amount.

The forming-a-bit-line-contact-hole includes: etching the insulating film; and etching the device isolation film and the active region with the same etch rate.

The forming-a-bit-line-and-a-bit-line-contact-plug includes: forming a polysilicon layer, a barrier metal layer, a bit line conductive layer and a hard mask layer on the upper portion of the bit line contact hole; forming a photoresist pattern that defines a bit line on the upper portion of the hard mask layer; and etching the hard mask layer, the bit line conductive layer, the barrier metal layer and the polysilicon layer with the photoresist pattern as an etching mask.

After forming a bit line and a bit line contact plug, the method further comprises forming a spacer insulating film on the upper portion of the bit line and the bit line contact plug.

The forming-a-spacer-insulating-film includes burying the bit line contact hole.

After forming a spacer insulating film, the method further comprises forming a storage node contact plug to be adjacent to the bit line.

The forming-a-storage-node-contact-plug includes: forming an interlayer insulating film on the upper portion of the spacer insulating film; forming a photoresist pattern that defines a storage node contact hole on the upper portion of the interlayer insulating film; etching the interlayer insulating film with the spacer insulating film formed at sidewalls of the bit line and the photoresist pattern as an etching mask; etching the spacer insulating film formed on the semiconductor substrate to expose the semiconductor substrate, thereby forming a storage node contact hole; and forming a conductive layer to bury the storage node contact hole.

The forming-a-storage-node-contact-hole includes etching a portion of the semiconductor substrate exposed in the storage node contact hole.

DESCRIPTION OF EMBODIMENTS

The present invention will be described in detail with reference to the attached drawings.

Figure 1:
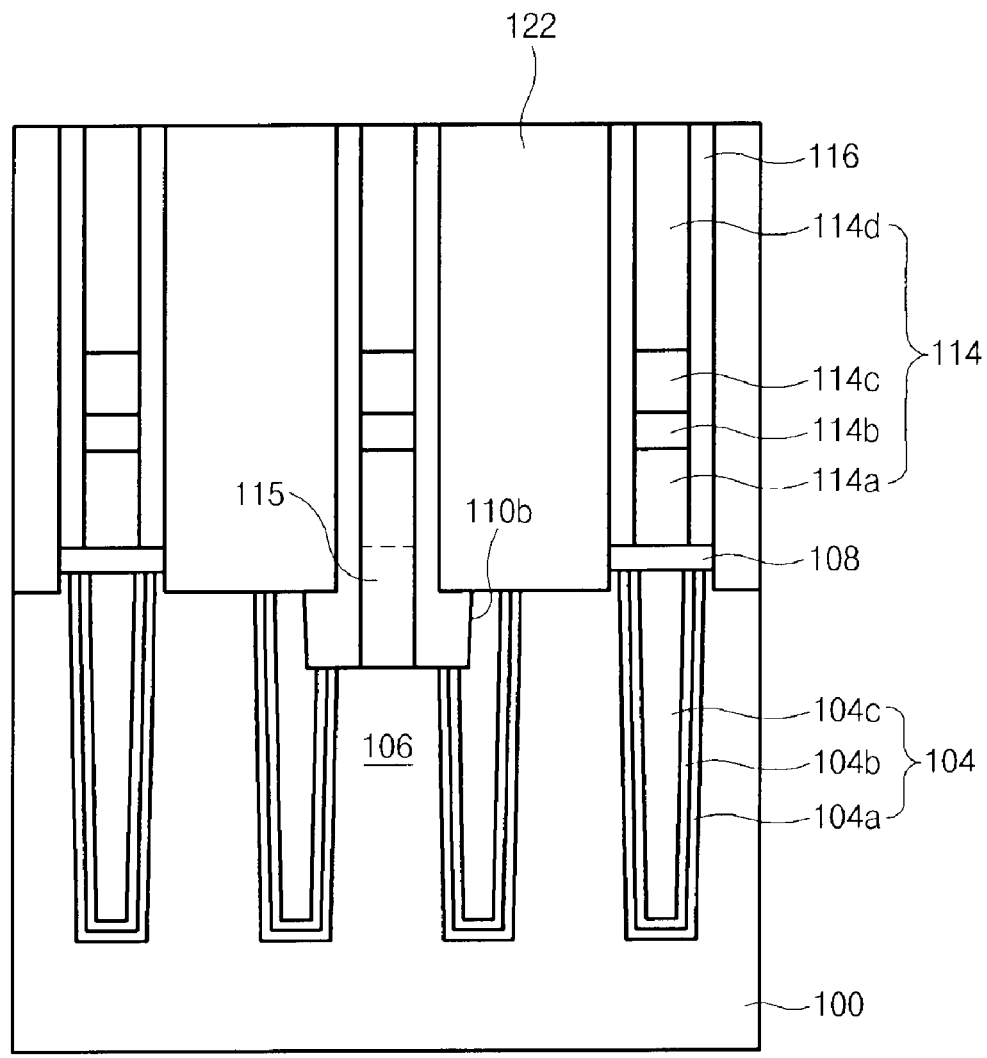
FIG. 1 is a cross-sectional diagram illustrating a semiconductor device according to an embodiment of the present invention.

FIG. 1 is a cross-sectional diagram illustrating a semiconductor device according to an embodiment of the present invention.

Referring to FIG. 1, the semiconductor device comprises a bit line 114 formed on a semiconductor substrate 100 including an active region 106 defined as a device isolation film 104, a bit line contact plug 115 disposed in the lower portion of the bit line 114 to have the same width as the bit line 114, a spacer insulating film 116 formed in sidewalls of the bit line contact plug 115 and the bit line 114, and a storage node contact plug 122 disposed between the bit lines 114 and insulated from the bit line 114 by the spacer insulating film 116.

The bit line contact plug 115 connected to the active region 106 in a bit line contact hole obtained by etching a given thickness of the semiconductor substrate 100 has a smaller width than that of the bit line contact hole. The side cross-sectional surface of the bit line contact hole has the same width of the upper portion as that of the lower portion of the bit line contact hole, or a larger width of the upper portion than that of the lower portion of the bit line contact hole. However, it is not limited herein, but can be modified into various shapes. The more detailed content will be described with reference to FIGS. 23 and 2f.

The above-structured semiconductor device comprises the bit line contact plug that has the same width as the bit line to prevent a bridge between the storage node contact plug and the bit line contact plug and to facilitate insulation of the storage node contact plug by the spacer insulating film formed to fill the bit line contact hole at both sides of the bit line contact plug.

FIGS. 2a to 2l are cross-sectional diagrams illustrating a method for manufacturing a semiconductor device according to an embodiment of the present invention.

Figure 2A:
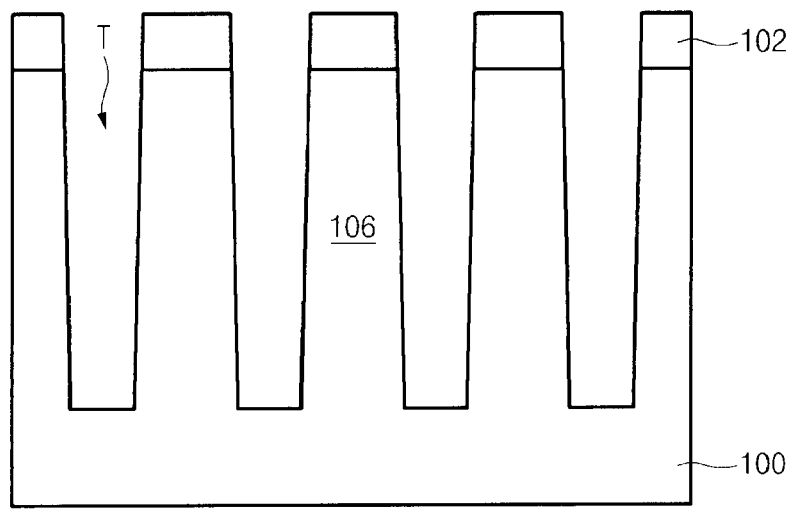
FIGS. 2a to 2l are cross-sectional diagrams illustrating a method for manufacturing a semiconductor device according to an embodiment of the present invention.

Referring to FIG. 2a, a pad nitride film 102 is formed on a semiconductor substrate 100, and a photoresist pattern (not shown) that defines a region where a device isolation film is expected to be formed. The pad nitride film 102 and the semiconductor substrate 100 are etched with the photoresist pattern (not shown) as an etching mask to form a trench T. In order to facilitate formation of the trench T, a pad oxide film may be further formed between the semiconductor substrate 100 and the pad nitride film 102, but will not be described in the embodiment of the present invention.

Figure 2B:
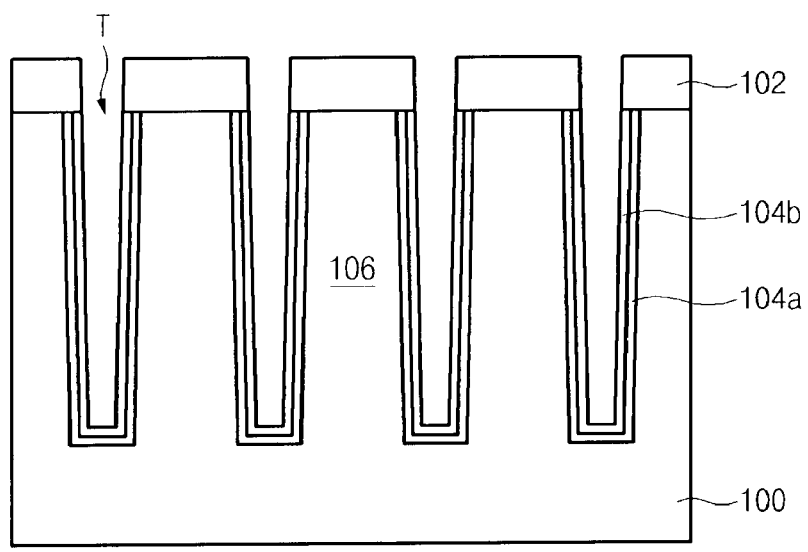

Referring to FIG. 2b, a sidewall oxide film 104a and a liner nitride film 104b are formed in a bottom portion and a sidewall portion of the trench T. The sidewall oxide film 104a improves a deposition capacity with the liner nitride film 104b performed by a subsequent process. The liner nitride film 104b buffers a stress generated by a thermal expansion coefficient difference from a separate isolation film 104c (see FIG. 2c) buried in the trench T. A preprocessing washing process may be further formed before the sidewall oxide film 104a and the liner nitride film 104b are formed.

Figure 2C:
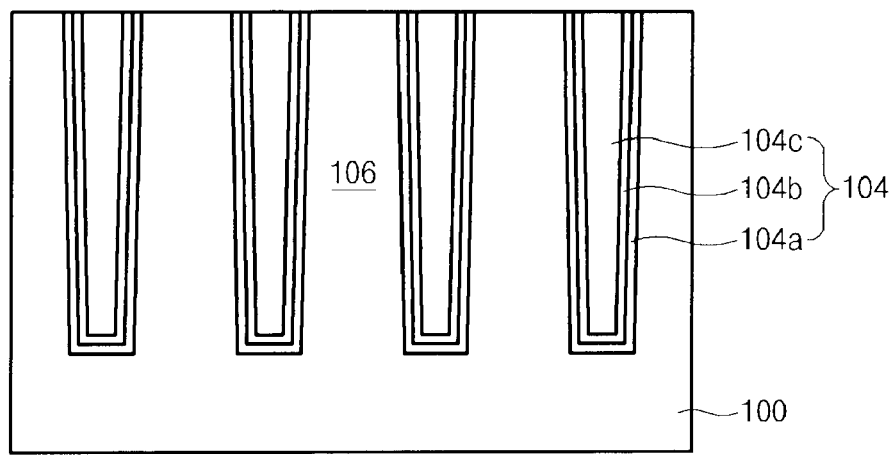

Referring to FIG. 2c, the separate insulating film 104 is formed on the upper portion of the liner nitride film 104b so that the trench T may be buried. A planarizing process is performed on the separate isolation film 104c to remove the pad nitride film 102, thereby completing the device isolation film 104. The separate insulating film 104c includes one selected from the group consisting of Spin On Dielectric (SOD), a High Density Plasma (HDP), but it is not limited herein. Any material that can fill the trench T can be used so that no space may remain in the trench T. In this process, the active region 106 is defined by the device isolation film 104.

Although it is not shown, after the device isolation film 104 is formed, the device isolation film 104 and the active region 106 are etched to form a trench, and a buried-type gate buried in the trench may be formed. However, a process for forming a buried-type gate will not be described in the embodiment of the present invention.

Figure 2D:
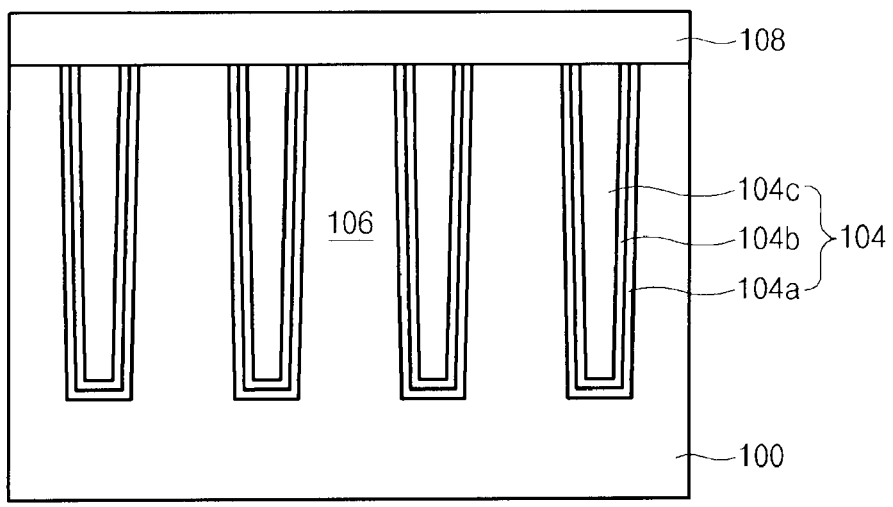

Referring to FIG. 2d, an insulating film 108 is formed on the upper portion of the semiconductor substrate 100. The insulating film 108 serves as a sacrificial film for forming a bit line contact hole, and may include an oxide film and/or a nitride film.

Figure 2E:
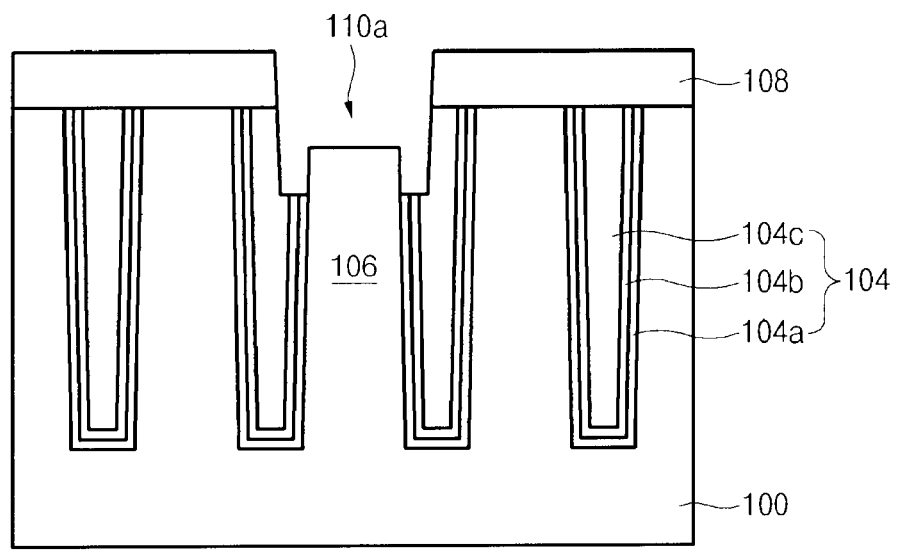
Figure 2F:
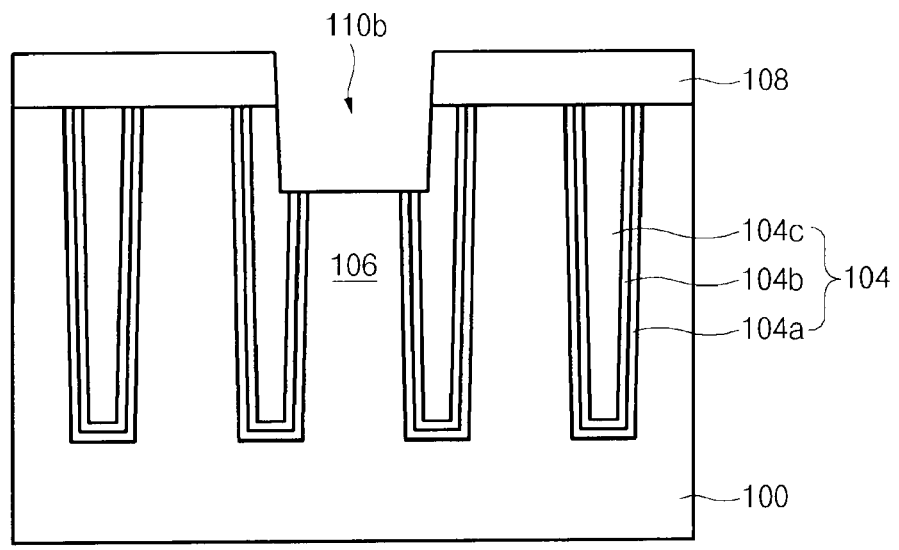

Referring to FIGS. 2e and 2f, the insulating film 108 and a given thickness of the semiconductor substrate 100 are etched to form a bit line contact hole.

A side cross-section of the bit line contact hole has the same width of the upper portion as that of the lower portion of the bit line contact hole or a larger width of the upper portion than that of the lower portion of the bit line contact hole. For example, when the width of the lower portion of the bit line contact hole is identical with that of the upper portion of the bit line contact hole, the side cross-section includes a rectangular shape. When the width of the lower portion of the bit line contact hole is larger than that of the upper portion of the bit line contact hole, the side cross-section includes an inverse trapezoid shape or a stair shape where its width becomes broader toward the upper portion. The stair shape may be formed when an etching process is differently performed depending on an etching selectivity of the sidewall oxide film 104a, the liner nitride film 104b and the separate insulating film 104c.

The above-described side cross-section shape of the bit line contact hole easily prevents a short between the bit line contact plug and a storage node contact plug formed after a bit line spacer is formed so that a spacer insulating film formed in a subsequent process may be buried in the bit line contact hole.

Hereinafter, a method for forming a bit line contact hole according to an embodiment of the present invention is described. The insulating film 108 and the device isolation film 104 are etched to form a first bit line contact hole 110a (see FIG. 2e). The active region 106 is etched to form a second bit line contact hole 110b, thereby obtaining the bit line contact hole (see FIG. 2f).

When the insulating film 108 is over-etched, the first bit line contact hole 110a may include a region obtained by etching the device isolation film 104. For example, the first bit line contact hole 110a may is be formed using a plasma gas including $CF_4$, $CHF_3$, $C_4F_8$ and $C_5F_8$ under a condition including a plasma source power ranging from 300 to 2000 W, a bias power ranging from 100 to 1000 W, a chamber pressure ranging from 10 to 100 mT. The first bit line contact hole 110a is formed while the insulating film 108 is etched, so that the active region 106 is not sufficiently removed. As a result, the process for forming the second bit line contact hole 110b is understood as that for removing the active region 106 to the bottom portion of the first bit line contact hole 110a where the device isolation film 104 is exposed.

The second bit line contact hole 110b may be formed using a plasma gas including $Cl_2$, HBr, $O_2$ and He under a condition including a plasma source power ranging from 300 to 2000 W, a bias power ranging from 0 to 200 W and a chamber pressure ranging from 10 to 100 mT. The ratio of a mixture gas including $Cl_2$ and HBr:$O_2$ ranges from 5:1 to 20:1. The ratio of He:$O_2$ ranges from 2:1 to 20:1.

Except the above-described method, the bit line contact hole may be formed by etching the active region 106 and the device isolation film 104 to have the same etch rate. This process may be applied when the active region 106 and the device isolation film 104 are etched after the insulating film 108 is etched to expose the semiconductor substrate.

Although it is not shown, after a spacer insulating film is formed on the resultant structure including the second bit line contact hole 110b, a spacer etching process is performed on the spacer insulating film, thereby forming a spacer at sidewalls of the second bit line contact hole 110b.

Figure 2G:
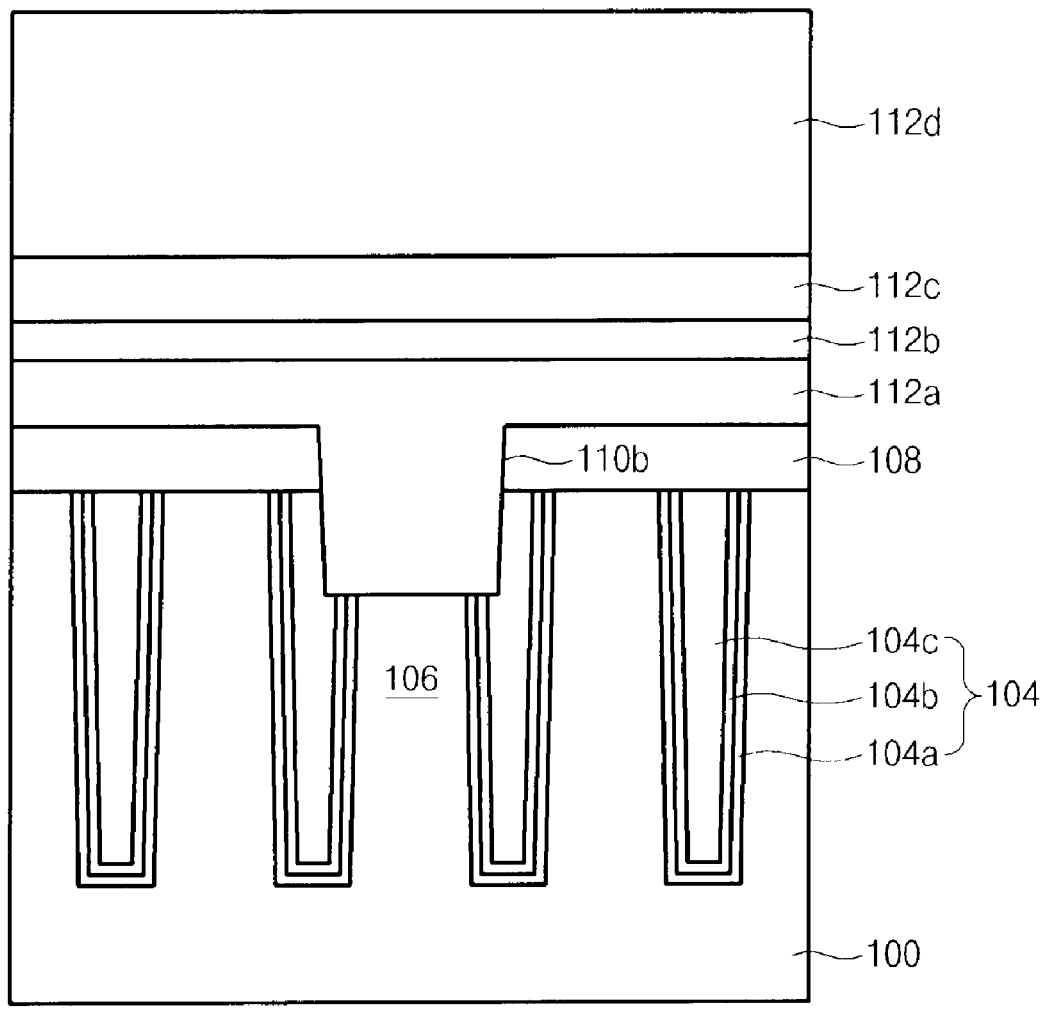

Referring to FIG. 2g, a polysilicon layer 112a, a barrier metal layer 112b, a bit line conductive layer 112c and a hard mask layer 112d are formed on the resultant structure including the second bit line contact hole 110b. An ion-implanting process is performed on the polysilicon layer 112a. The bit line conductive layer 112c includes tungsten that has an excellent electric conductivity. The barrier metal layer 112b includes one selected from the group consisting of a titanium film, a titanium nitride film, a tungsten nitride film and combinations thereof. The hard mask layer 112d includes a nitride film.

Figure 2H:
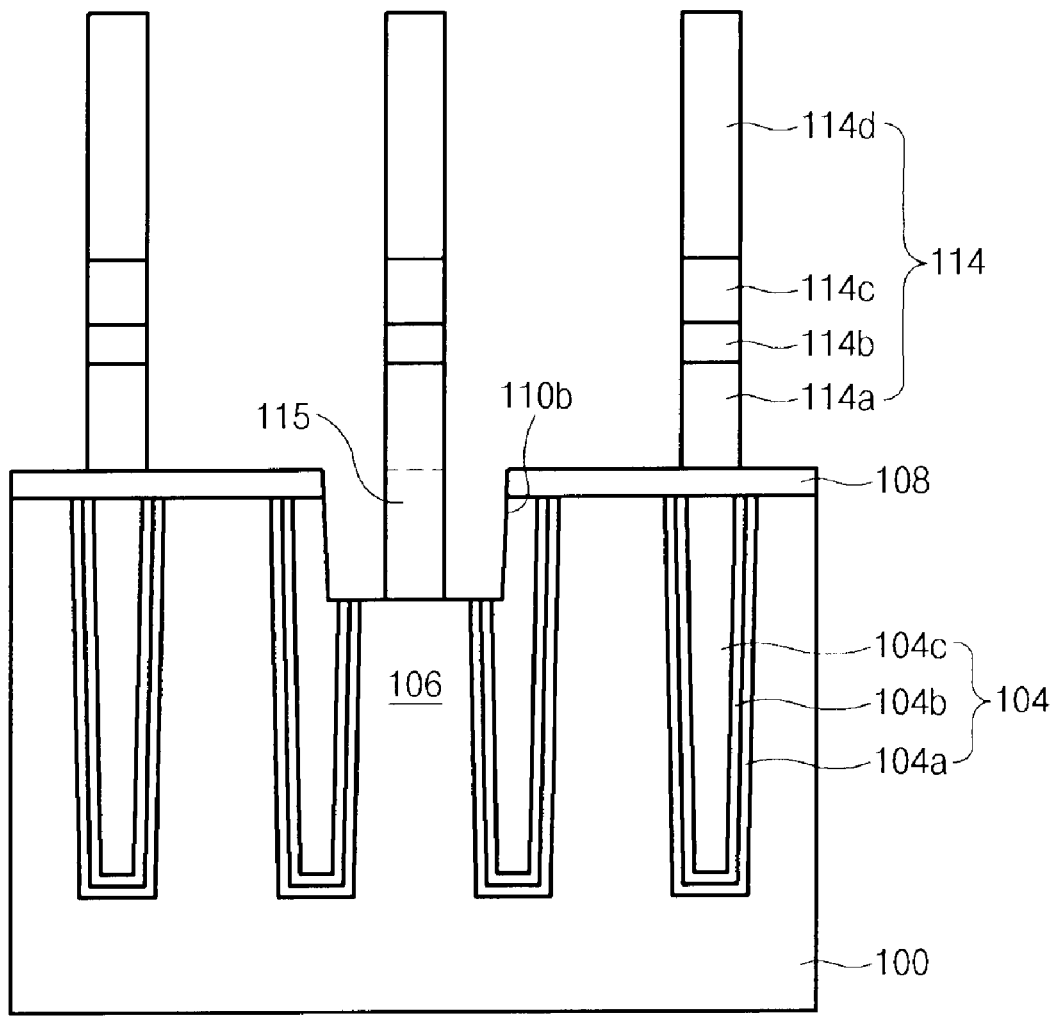

Referring to FIG. 2h, a photoresist pattern (not shown) that defines a bit line is formed on the upper portion of the hard mask layer 112d. An etching process is performed with the photoresist pattern (not shown) as an etching mask to form the bit line 114 that has a stacked structure including a polysilicon pattern 114a, a barrier metal pattern 114b, a bit line conductive pattern 114c and a hard mask pattern 114d.

Hereinafter, the polysilicon pattern 114a formed in the second bit line contact hole 110b is designated as the bit line contact plug 115. The bit line contact plug 115 is formed simultaneously while the bit line is patterned so that the bit line contact plug 115 has the same width as that of the bit line. The bit line contact plug 115 has a smaller width than that of the second bit line contact hole 110b.

The bit line contact plug 115 is formed to have the same width as that of the bit line so as to have a smaller width than that of the second bit line contact hole 110b, thereby preventing a short of the storage node contact plug formed in a subsequent process. The area where the bit line contact plug 115 contacts with the bit line is smaller than that where the bit line contact plug for burying the entire bit line contact hole 110b contacts with the bit line in the prior art. As a result, a contact resistance increases with a given range in comparison with the prior art. However, it does not matter because the increase range does not degrade a semiconductor characteristic.

Meanwhile, the process for forming the bit line 114 and the bit line contact plug 115 includes two steps because a condition for etching the polysilicon layer 114a is different in order to have the same width as that of the bit line when the bit line contact plug 115 is formed. More specifically, the process for forming the bit line 114 and the bit line contact plug 115 includes a first step of forming the barrier metal pattern 114b, the bit line conductive pattern 114c and the hard mask pattern 114d and a second step of forming the polysilicon pattern 114a.

The first step is performed using a plasma gas including NF$_3$, SF$_6$, Cl$_2$, N$_2$ and He under a condition including a plasma source power ranging from 300 to 1500 W, a bias power ranging from 100 to 300 W and a chamber pressure ranging from 2 to 30 mT. NF$_3$ has a flowing amount ranging from 20 to 40 sccm, SF$_6$ ranging from 30 to 50 sccm, Cl$_2$ ranging from 50 to 70 sccm, N$_2$ ranging from 20 to 40 sccm and He ranging from 20 to 40 sccm.

The second step is performed using a plasma gas including Cl$_2$, HBr, O$_2$ and He under a condition including a plasma source power ranging is from 200 to 1000 W, a bias power ranging from 100 to 300 W and a chamber pressure ranging from 20 to 100 mT. Cl$_2$ has a flowing amount ranging from 10 to 30 sccm, HBr ranging from 190 to 210 sccm, O$_2$ ranging from 10 to 30 sccm and He ranging from 190 to 210 sccm.

Figure 2I:
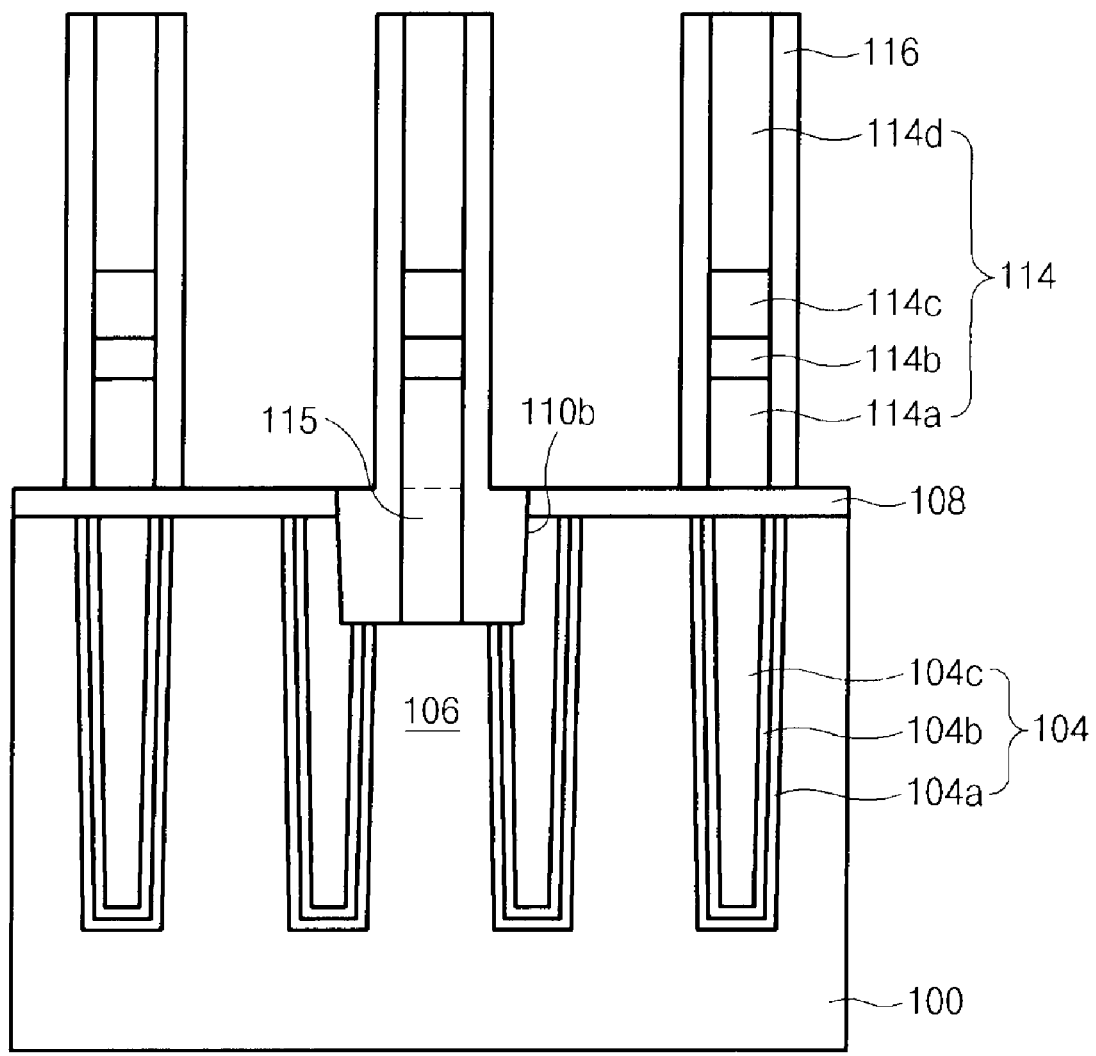

Referring to FIG. 2i, the spacer insulating film 116 is formed at sidewalls of the bit line 114 and the bit line contact plug 115. The spacer insulating film 116 is formed so as to be completely buried in the second bit line contact hole 110b, thereby preventing a bridge between the bit line contact plug 115 and the storage node contact plug 122 (see FIG. 2l) formed in a subsequent process.

Figure 2J:
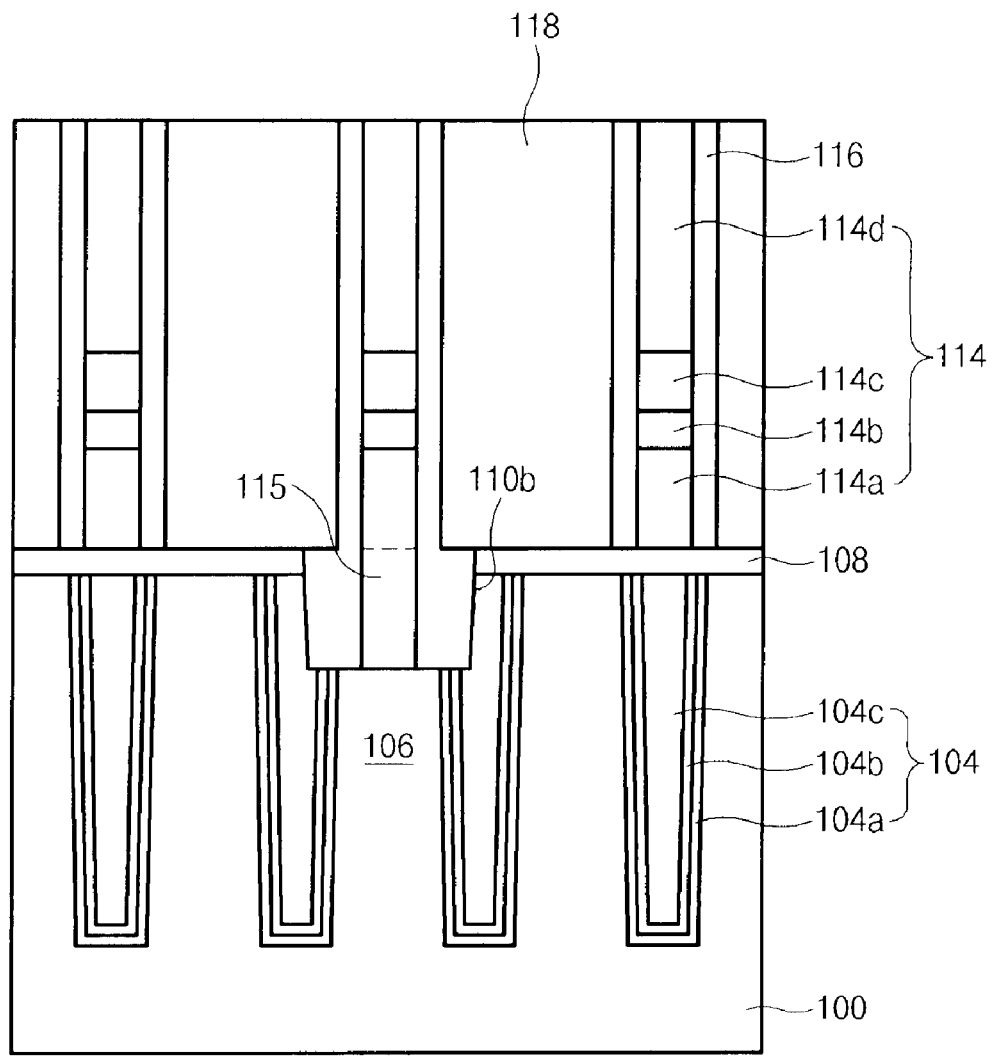

Referring to FIG. 2j, the interlayer insulating film 118 is formed so that a gap between the spacer insulating films 116 may be filled.

Figure 2K:
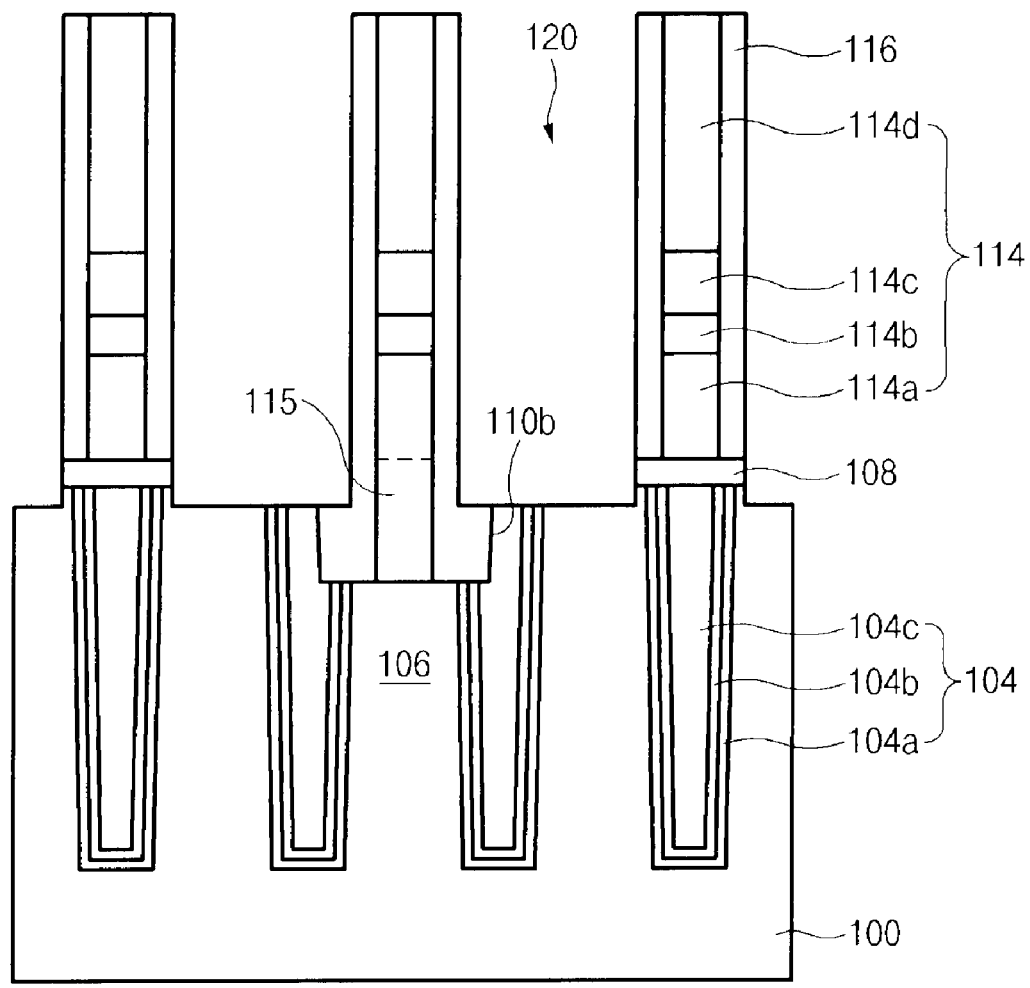

Referring to FIG. 2k, a photoresist pattern (not shown) that defines a storage node contact hole is formed on the upper portion of the interlayer insulating film 118. The interlayer insulating film 118 is etched with the photoresist pattern (not shown) and the spacer insulating film formed at the sidewall of the bit line 114 as a mask. The spacer insulating film 116 and the insulating film 108 are etched to expose the semiconductor substrate 100, thereby forming a storage node contact hole 120. Since the interlayer insulating film 118 is etched with a different etching selectivity from that of the spacer insulating film 116, the spacer insulating film 116 formed at the sidewall of the bit line 114 is not damaged, thereby preventing damage of the bit line 114 and the bit line contact plug 115. The storage node contact hole 120 may be formed by etching a given thickness of the semiconductor substrate 100 in order to increase the contact area with the storage node contact plug formed in a subsequent process.

Figure 2L:
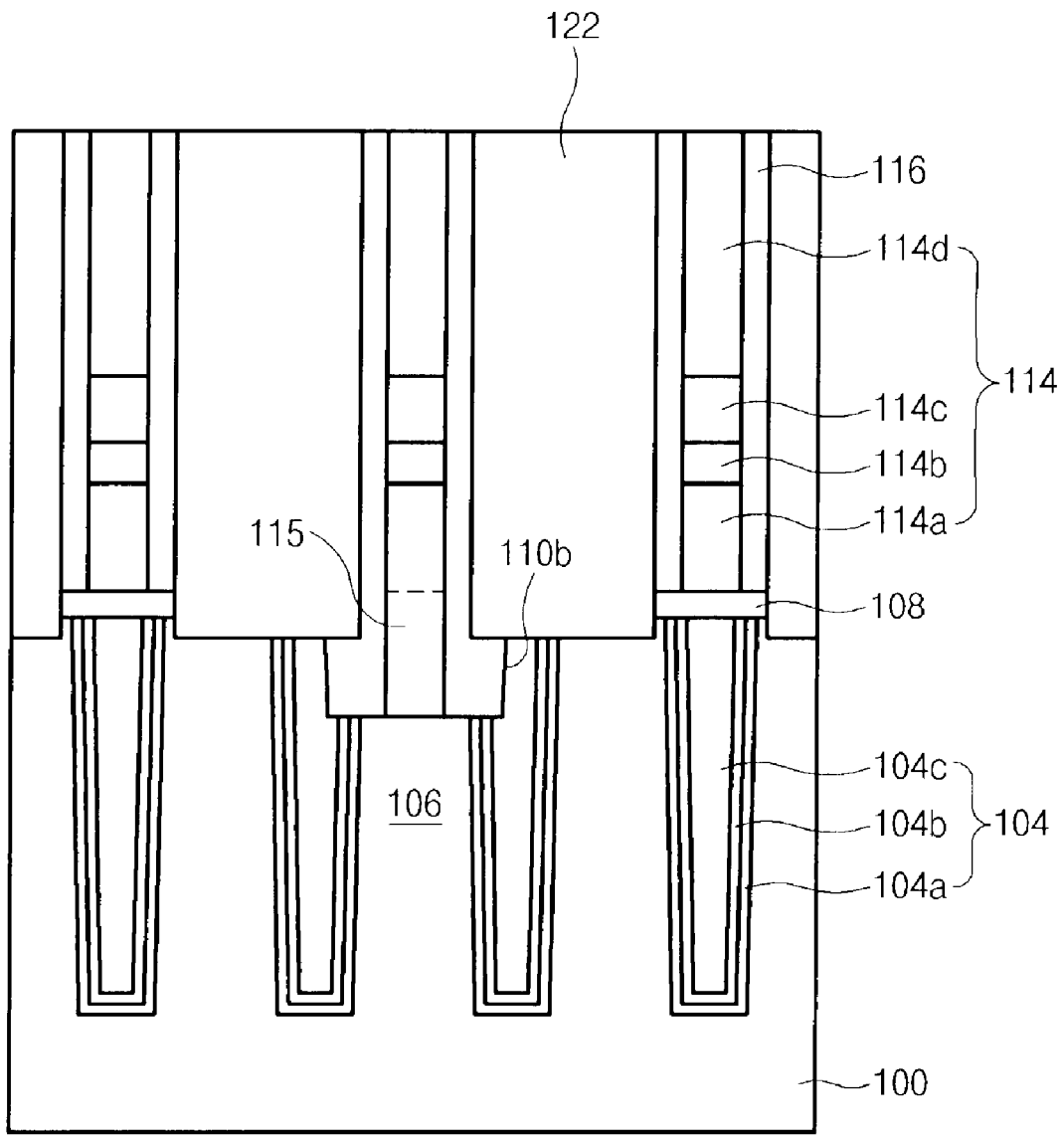

Referring to FIG. 2l, after a conductive layer is formed to fill the storage node contact hole 120, a planarizing process is performed on the conductive layer to expose the hard mask pattern 114d, thereby forming a storage node contact plug 122.

As described above, a semiconductor device according to an embodiment of the present invention comprises a bit line contact plug formed simultaneously while a bit line is patterned so that the bit line contact plug has the same width as that of the bit line, thereby preventing a short of the bit line contact plug and the storage node contact plug to improve characteristics of the semiconductor device.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
   a semiconductor substrate including an active region defined by a device isolation film;
   a bit line contact hole obtained by etching the active region and the device isolation film;
   a bit line contact plug within the bit line contact hole;
   a bit line coupled to the upper portion of the bit line contact plug; and
   a spacer formed on sidewalls of the bit line and the bit line contact plug in the bit line contact hole.

2. The semiconductor device according to claim 1, wherein the device isolation film includes:
   a trench formed in the semiconductor substrate;
   a sidewall oxide film formed on the surface of the trench;
   a liner nitride film formed on the surface of the sidewall oxide film; and
   a separate insulating film formed on the surface of the liner nitride film so as to bury the trench.

3. The semiconductor device according to claim 1, wherein the side cross-sectional surface of the bit line contact hole has the same width of the upper portion as that of the lower portion of the bit line contact hole.

4. The semiconductor device according to claim 1, wherein the side cross-sectional surface of the bit line contact hole has a larger width of the upper portion than that of the lower portion of the bit line contact hole.

5. The semiconductor device according to claim 1, wherein the bit line contact plug has the same width as that of the bit line.

6. The semiconductor device according to claim 1, wherein the spacer formed in sidewalls of the bit line contact plug is buried in the bit line contact hole.

7. The semiconductor device according to claim 1, further comprising a storage node contact plug formed to be adjacent to the bit line.

8. The semiconductor device according to claim 1, further comprising a buried-type gate buried in the semiconductor substrate.

9. A method for manufacturing a semiconductor device, the method comprising:
   forming a device isolation film defining an active region in a semiconductor substrate;
   etching the active region and the device isolation film to form a bit line contact hole; and
   forming a bit line and a bit line contact plug over the semiconductor substrate using a same etching mask.

10. The method according to claim 9, wherein the forming-a-device-isolation-film includes:
    forming a trench for device isolation;
    forming a sidewall oxide film in the sidewall and the lower portion of the trench for device isolation;
    forming a liner nitride film on the upper portion of the sidewall oxide film; and
    forming a separate insulating film on the upper portion of the liner nitride film to bury the trench for device isolation.

11. The method according to claim 9, after forming a device isolation film, further comprising forming a buried-type gate buried in the semiconductor substrate.

12. The method according to claim 9, before forming a bit line contact hole, further comprising forming an insulating film on the semiconductor substrate.

13. The method according to claim 12, wherein the forming-a-bit-line-contact-hole includes:
    etching a portion of the device isolation film and the insulating film to form a first bit line contact hole; and forming a second bit line contact hole to etch the active region to the bottom portion of the first bit line contact hole to expose the device isolation film.

14. The method according to claim 13, wherein the device isolation film and the active region are etched with the same etch amount.

15. The method according to claim 12, wherein the forming-a-bit-line-contact-hole includes:
    etching the insulating film; and
    etching the device isolation film and the active region with the same etch rate.

16. The method according to claim 9, wherein the forming-a-bit-line-and-a-bit-line-contact-plug includes:
    forming a polysilicon layer, a barrier metal layer, a bit line conductive layer and a hard mask layer on the upper portion of the bit line contact hole;
    forming a photoresist pattern that defines a bit line on the upper portion of the hard mask layer; and
    etching the hard mask layer, the bit line conductive layer, the barrier metal layer and the polysilicon layer with the photoresist pattern as an etching mask.

17. The method according to claim 9, after forming a bit line and a bit line contact plug, further comprising forming a spacer insulating film on the upper portion of the bit line and the bit line contact plug.

18. The method according to claim 17, wherein the forming-a-spacer-insulating-film includes burying the bit line contact hole.

19. The method according to claim 17, after forming a spacer insulating film, further comprising forming a storage node contact plug to be adjacent to the bit line.

20. The method according to claim 19, wherein the forming-a-storage-node-contact-plug includes:
    forming an interlayer insulating film on the upper portion of the spacer insulating film;
    forming a photoresist pattern that defines a storage node contact hole on the upper portion of the interlayer insulating film;
    etching the interlayer insulating film with the spacer insulating film formed at sidewalls of the bit line and the photoresist pattern as an etching mask;
    etching the spacer insulating film formed on the semiconductor substrate to expose the semiconductor substrate, thereby forming a storage node contact hole; and
    forming a conductive layer to bury the storage node contact hole.

21. The method according to claim 20, wherein the forming-a-storage-node-contact-hole includes etching a portion of the semiconductor substrate exposed in the storage node contact hole.

* * * * *